(12) United States Patent
Chieh

(10) Patent No.: US 10,607,953 B1
(45) Date of Patent: Mar. 31, 2020

(54) SUBSTRATE-LESS WAVEGUIDE ACTIVE CIRCUIT MODULE WITH CURRENT MODE POWER COMBINING

(71) Applicant: The United States of America, as represented by the Secretary of the Navy, San Diego, CA (US)

(72) Inventor: Jia-Chi S. Chieh, San Diego, CA (US)

(73) Assignee: United States of America as represented by Secretary of the Navy, Washington, DC (US)

( * ) Notice: Subject to any disclaimer, the term of this patent is extended or adjusted under 35 U.S.C. 154(b) by 0 days.

(21) Appl. No.: 16/228,438

(22) Filed: Dec. 20, 2018

(51) Int. Cl.
| | |
|---|---|
| *H01L 23/66* | (2006.01) |
| *H01L 23/053* | (2006.01) |
| *H01L 23/00* | (2006.01) |
| *H01L 21/48* | (2006.01) |
| *H01P 3/123* | (2006.01) |
| *H01P 11/00* | (2006.01) |

(52) U.S. Cl.
CPC .......... *H01L 23/66* (2013.01); *H01L 21/4817* (2013.01); *H01L 23/053* (2013.01); *H01L 24/48* (2013.01); *H01P 3/123* (2013.01); *H01P 11/002* (2013.01); *H01L 2223/6611* (2013.01); *H01L 2223/6683* (2013.01); *H01L 2224/48225* (2013.01); *H01L 2224/48455* (2013.01)

(58) Field of Classification Search
CPC ... H01L 23/66; H01L 23/053; H01L 21/4817; H01L 24/48; H01L 2223/6611; H01L 2223/6683; H01L 2224/48225; H01L 23/48455; H01P 5/08; H01P 3/123

USPC ........................................................ 257/664
See application file for complete search history.

(56) References Cited

U.S. PATENT DOCUMENTS

| 7,215,220 B1 | 5/2007 | Jia | |
|---|---|---|---|
| 2006/0202777 A1 | 9/2006 | Deckman et al. | |
| 2019/0057945 A1* | 2/2019 | Maaskant | H01P 3/121 |

OTHER PUBLICATIONS

B. Ahmadi et al., "Substrateless Amplifier Module Realized by Ridge Gap Waveguide Technology for Millimeter-Wave Applications," IEEE Transactions on Microwave Theory and Techniques, vol. 64, No. 11, pp. 3623-3630, Nov. 2016.

* cited by examiner

*Primary Examiner* — Tong-Ho Kim
(74) *Attorney, Agent, or Firm* — Naval Information Warfare Center, Pacific; Kyle Eppele; Elliott J. Deaderick

(57) ABSTRACT

A device includes an enclosure cover having a groove portion disposed on one surface, a chip carrier attachable to and removable from the enclosure cover in the groove portion, the chip carrier including at least two cavities disposed on one surface and located on opposite sides, each cavity has a slot extending to an opposite surface of the chip carrier. Also included is a ridge gap waveguide (RGW) cover with a plurality of pillars disposed on one surface, and a plurality of ridges are also disposed on the one surface. Each ridge includes a branching junction such that each ridge branches to at least two ridge portions. The enclosure cover and the RGW cover are configured to connect to each other with the chip carrier located therebetween, and the opposite surface of the chip carrier faces the one surface of the RGW cover.

20 Claims, 15 Drawing Sheets

SUBSTRATE-LESS WAVEGUIDE ACTIVE CIRCUIT MODULE WITH CURRENT MODE POWER COMBINING

FEDERALLY-SPONSORED RESEARCH AND DEVELOPMENT

The United States Government has ownership rights in the subject matter of the present disclosure. Licensing inquiries may be directed to the Office of Research and Technical Applications, Space and Naval Warfare Systems Center Pacific, Code 72120, San Diego, Calif. 92152. Phone: (619) 553-5118; email: ssc_pac_t2@navy.mil. Refer to Navy Case No. 108061.

BACKGROUND

Ridge gap waveguides (RGWs) typically require an E-plane probe for the transition to a microstrip. Typical system topologies require designing an additional interface (substrate) between the waveguide and the microstrip, thereby adding to the cost and complexity of the design and potentially adding lossy properties. Certain proposed techniques require a coupling probe on-chip or an additional substrate to bond to the microstrip. A need exists for an RGW to microstrip transition that does not require a transition substrate and allows for quick substitution/exchange of the microstrip.

SUMMARY

The present disclosure describes devices and methods for a substrate-less waveguide active circuit module with current mode power combining. According to an illustrative embodiment, a device is provided that includes: an enclosure cover including a groove portion disposed on one surface; a chip carrier attachable to and removable from the enclosure cover in the groove portion, the chip carrier including at least two cavities disposed on one surface and located on opposite sides, each cavity having a slot extending to an opposite surface of the chip carrier; a ridge gap waveguide (RGW) cover including a plurality of pillars disposed on one surface; and a plurality of ridges disposed on the one surface of the RGW cover, wherein each ridge includes a branching junction such that each ridge branches to at least two ridge portions. The enclosure cover and the RGW cover are configured to connect to each other with the chip carrier located therebetween, and the opposite surface of the chip carrier faces the one surface of the RGW cover when the enclosure cover and the RGW cover are connected.

BRIEF DESCRIPTION OF THE DRAWINGS

Features of illustrative embodiments will be best understood from the accompanying drawings, taken in conjunction with the accompanying description, in which similarly-referenced characters refer to similarly-referenced parts. The elements in the drawings may not be drawn to scale. Some elements and/or dimensions may be enlarged or minimized, as appropriate, to provide or reduce emphasis and/or further detail.

DETAILED DESCRIPTION OF VARIOUS EMBODIMENTS

References in the present disclosure to "one embodiment," "an embodiment," or similar phrases, means that a particular element, feature, structure, or characteristic described in connection with the embodiments is included in at least one embodiment. The appearances of the phrases "in one embodiment," "in some embodiments," and "in other embodiments," or similar phrases, in various places in the present disclosure are not necessarily all referring to the same embodiment or the same set of embodiments.

As used herein, the terms "comprises," "comprising," "includes," "including," "has," "having," or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. The word "chip" as it is used in the specification and claims pertains to a component that is known in the art and referred to as a computer chip, microchip, or an integrated circuit.

Additionally, use of "the," "a," "an," or similar language, are employed to describe elements and components of the embodiments herein; this is done merely for grammatical reasons and to conform to idiomatic English. This detailed description should be read to include one or at least one, and the singular also includes the plural unless it is clearly meant otherwise.

The embodiments disclosed herein describe a substrate-less waveguide active circuit module that is suitable for, e.g., current mode power combining, a self-packaged waveguide eliminating the requirement for an additional substrate, etc.

Figure 1:
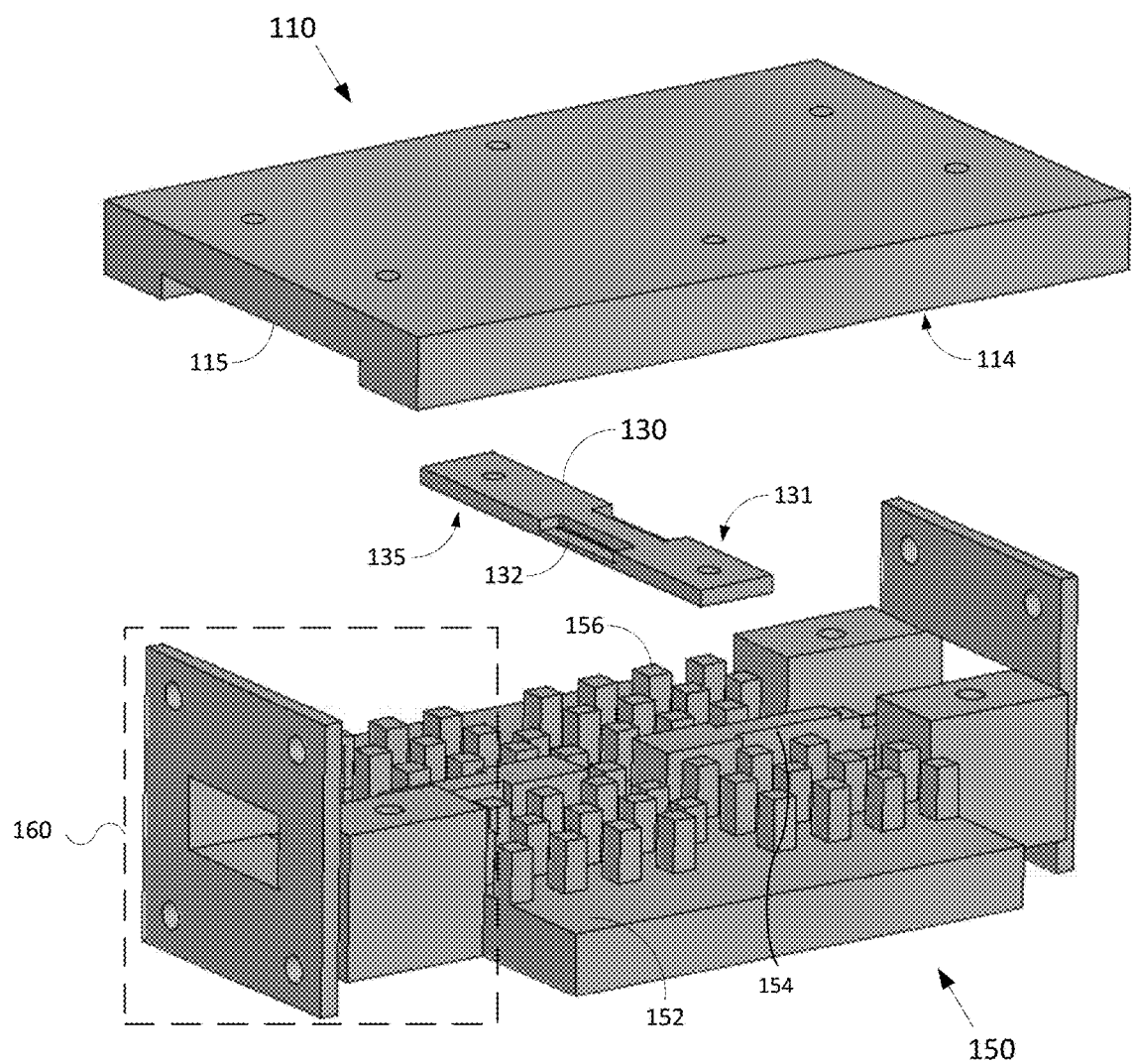
FIG. 1 is an exploded view of an embodiment of a device in accordance with the subject matter of the present disclosure.

FIG. 1 shows an exploded view of an embodiment of a device 100 including an enclosure cover 110. The various components of device 100 may be composed of conductive metal/alloys or other conductive material. In some embodiments, enclosure cover 110 may have a grooved portion disposed on one surface 114. A chip carrier 130 is attachable to and removable from enclosure cover 110. Chip carrier 130 may be attachable to and removable from the grooved portion if present in an embodiment. Chip carrier 130 may include at least two cavities 132 disposed on one surface 131 and located on opposite sides of one surface 131, each cavity 132 having a slot 133 (see FIGS. 4B & 6) extending to an opposite surface 135 of chip carrier 130. Slots 133 may be configured such that one dimension of a slot 133 is substantially equal to one dimension of its corresponding cavity 132 (see FIG. 6). The embodiment in FIG. 1 shows chip carrier 130 having two cavities 132, but other embodiments may include a different number of cavities 132. A ridge gap waveguide (RGW) cover 150 may include a plurality of ridges 154 and a plurality of pillars 156 disposed on one surface 152. Pillars 156 may be at least a quarter-wave ($\lambda/4$) in height.

Enclosure cover 110 and RGW cover 150 may be configured to connect to each other with chip carrier 130 located therebetween (and attached to enclosure cover 110). Covers 110 and 150 may act as a perfect electric conductor (PEC) and a perfect magnetic conductor (PMC), respectively. Ridges 154 may allow a quasi-transverse electromagnetic (TEM) wave to propagate between ridges 154 and cover 110. Opposite surface 135 of chip carrier 130 faces surface 152 of RGW cover 150 when covers 110 and 150 are connected. Each ridge 154 may be surrounded by pillars 156 on opposite sides of each ridge 154 such that propagation of the quasi-TEM wave is facilitated between ridges 154 and the enclosure cover 110 when connected to the RGW cover 150. Pillars 156 may act as high-impedance structures configured to prevent the quasi-TEM wave from propagating in a direction other than a direction along ridges 154.

FIG. 1 shows end portion 115 of enclosure cover 110 (another end portion 115 is present but not shown on the opposite side) which is designed to fit to section 160 of RGW cover 150 for the purpose of connecting the covers 110 and 150.

Figure 4A:
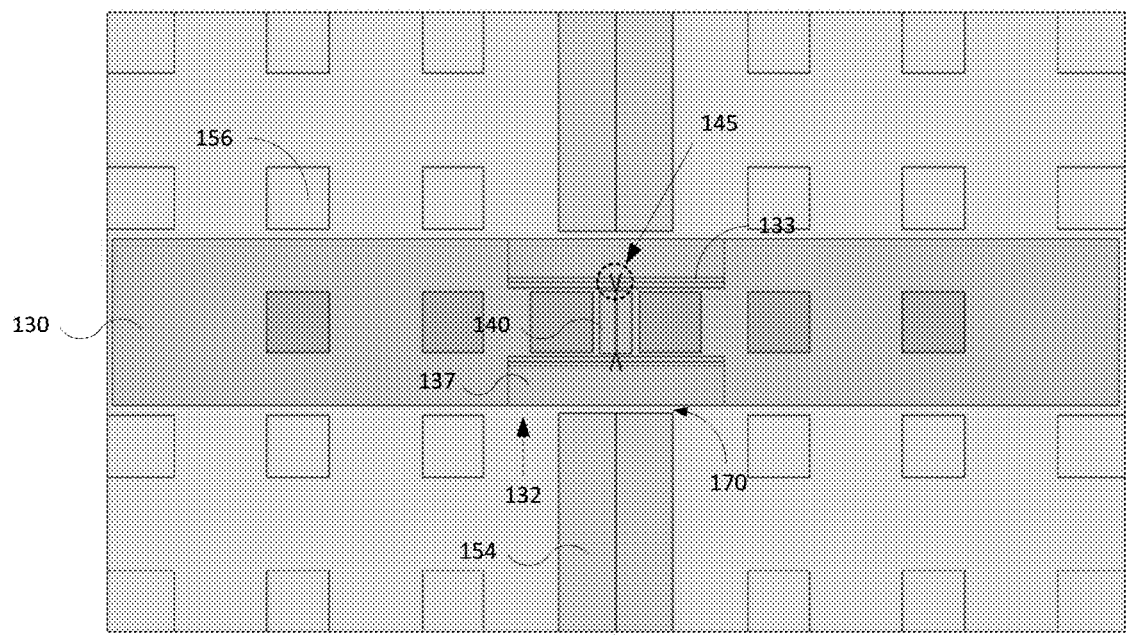
FIGS. 4A & 4B respectively show a top view and a side view of a device in accordance with an embodiment.

FIG. 4A shows a top view of device 100 when covers 110 and 150 are connected (chip carrier 130 is below RGW cover 150). Coupling gap 170 is observable from this top view when covers 110 and 150 are connected. Energy (the quasi-TEM wave) propagates down the RGW and couples through coupling gap 170 into cavity 132 directly abutting pedestal portion 137 (see also FIG. 6). In some embodiments, coupling gap 170 is about 4 mm. The energy then travels through slot 133 and instead of escaping through slot 133 is redirected to flow through bond wires 145 that are connected to microstrip 140.

Pillars 156 may also be configured to prevent higher order parallel plate modes from occurring due to the PEC and PMC surfaces. Parallel plate modes formed by the PEC and PMC surfaces could cause any electromagnetic (EM) signals (e.g., the quasi-TEM wave) to be drawn out of the waveguide or could cause signal leakage. Pillars 156 may be configured to suppress these parallel plate modes and thereby facilitate propagation of the quasi-TEM wave along ridges 154 in the RGW. As a result, such a configuration limits extra mode excitation that would otherwise degrade the performance of device 100 and cause high signal loss or prevent signal propagation.

Figure 5A:
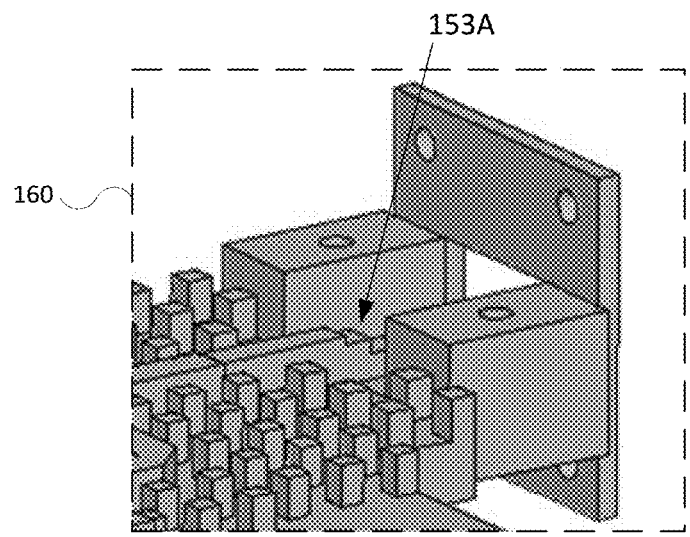
FIGS. 5A & 5B show transition portions of ridges substantially within parallelepiped waveguides.
Figure 5B:
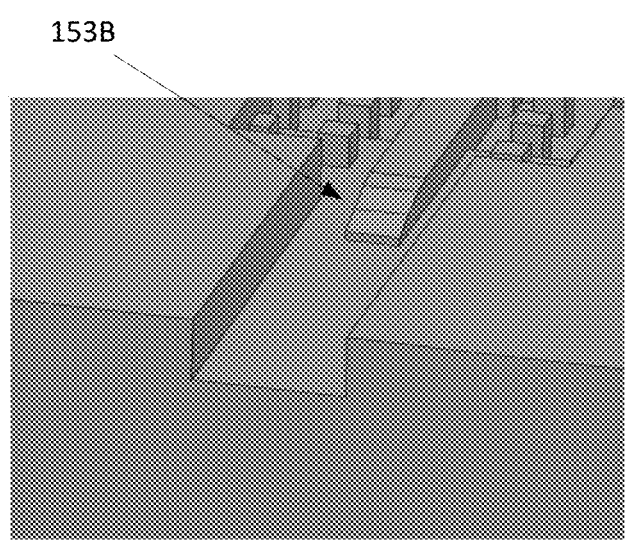

A parallelepiped waveguide, as shown in sections 160 of FIG. 1, may be disposed on one side of RGW cover 150 and on the one surface 152 (and another parallelepiped waveguide may be present on an opposite side of RGW cover 150, as shown). A transition portion 153 of each ridge 154 may be located substantially within each parallelepiped waveguide 160 (see FIGS. 5A & 5B). Transition portion 153 may be stepped or sloped. A stepped transition portion 153A (FIG. 5A) includes steps of equal heights beginning at surface 152 and ending at a top side of ridge 154. A sloped transition portion 153B (FIG. 5B) includes a slope that begins at surface 152 and ends at the top side of ridge 154. In embodiments using a sloped transition portion 153B, the slope may aid in preventing discontinuities and improving impedance matching when transferring from one modality (a parallelepiped waveguide) to another modality (an RGW). The transition between the two modalities (i.e., transition portion 153) has unique impedance characteristics based on its length, width, and steps or slopes. Transitioning from one modality to another modality is aided when the impedance between the two remains substantially the same, and the design of transition portion 153 may prevent impedance discontinuities and may aid in retaining signal integrity.

As shown in FIG. 4A, millimeter-wave monolithic integrated circuit (MMIC) 140, which may also be referred to as a monolithic microwave integrated circuit, may be located on opposite surface 135 of chip carrier 130 and between slots 133. MMIC 140 may be connected to chip carrier 130 via bond wires 145 located on opposite sides of MMIC 140 (see FIGS. 4A & 4B). Bond wires 145 may extend across slots 133 to pedestal portion 137 with dual-wedge bonds in order to lower the inductance of bond wires 145. MMIC 140 may be epoxy-bonded onto opposite surface 135 or may be attached using other means as contemplated by one of ordinary skill in the art.

Figure 6:
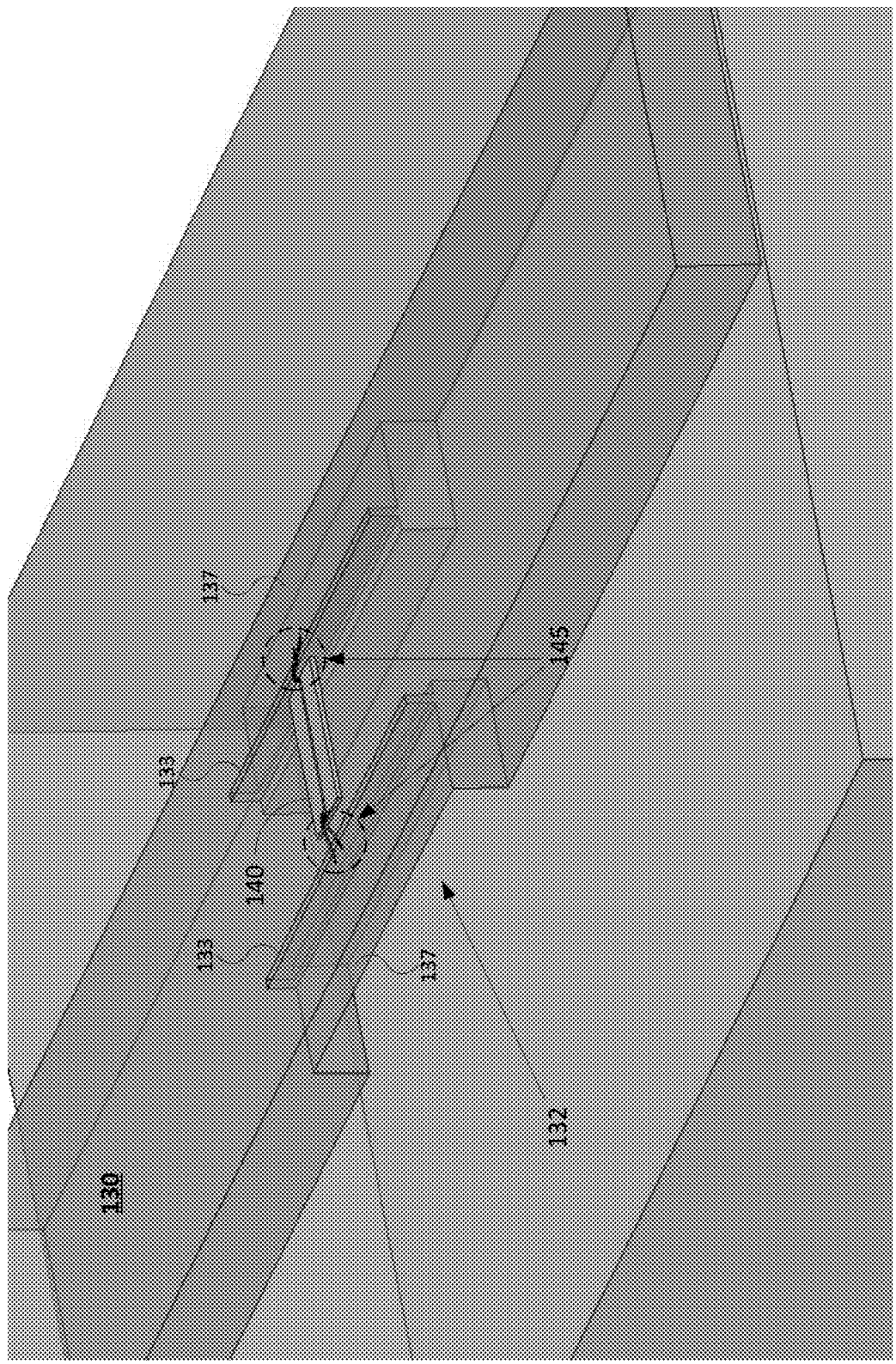
FIG. 6 illustrates an angled view of a chip carrier in accordance with an embodiment of a device.

Chip carrier 130 may include a pedestal portion 137 adjacent to each slot 133, as shown in FIG. 6. Pedestal portion 137 may be disposed on a side of slot 133 that is opposite MMIC 140. Each pedestal portion 137 may be located on opposite surface 135 and directly abutting a cavity 132 disposed on surface 131. A length and a width of pedestal portion 137 may be optimized to correspond to an operating frequency of device 100 during propagation of the quasi-TEM wave. In some embodiments, pedestal portion 137 is about 30 mm, but the thickness may range from about 8 mm to about 30 mm. A pedestal portion within such a thickness range may provide for greater stability and rigidity during use of chip carrier 130, as well as feasibility in machining/manufacturing of said part.

Device 100 is configured such that the quasi-TEM wave propagates through cavities 132 in chip carrier 130 and into slots 133, which are configured to act as resonant slot antennas. The quasi-TEM wave propagates through slots 133 and bond wires 145 act as the transmission medium for the quasi-TEM wave to MMIC 140. Slot 133 is in the same plane as MMIC 140, which is unlike conventional RGW devices that place the slot in the orthogonal plane. This design can tolerate up to 30 mm of offset without significant degradation in performance in the passband. The RGW to MMIC transition may include bond wires 145 up to 50 mm in length, wherein the performance is wideband with an average insertion loss of 0.52 dB from about 11 GHz to about 18 GHz with no offset.

Chip carrier 130 may be hot-swappable, i.e., chip carriers can be swapped in and out of enclosure cover 110 because of the removability of chip carrier 130 from enclosure cover 110, thereby lending to ease of use and replacement if an MMIC fails. Chip carrier 130 may be attached/removed using screws (FIG. 1 shows various screw holes (not labeled) on covers 110 and 150, and on chip carrier 130), but other attaching/removing means may be utilized as contemplated by a person of ordinary skill in the art (e.g., using clasps, clamps, latches, locking pins, etc.). This configuration of device 100 allows for bypassing an E-plane substrate probe and bonding the MMIC directly to the metal case.

Figure 4B:
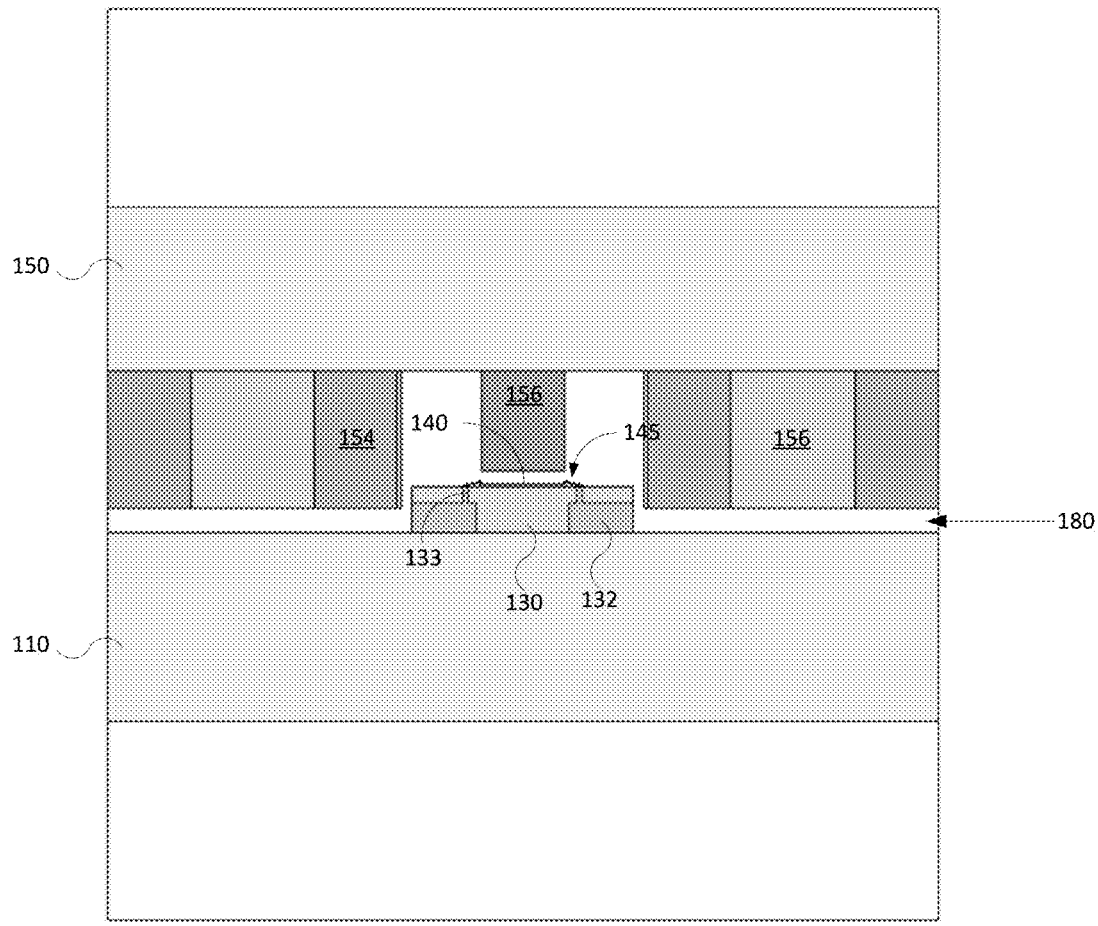

FIG. 4B illustrates a side profile view of device 100 showing the chip to RGW transition. Slots 133 are shown above cavities 132 and MMIC 140 is located between slots 133. Wire bonds 145 are on the sides of MMIC 140 and extend across slots 133 onto pedestal portion 137. Gap height 180 is the distance between covers 110 and 150 when connected. In some embodiments gap height 180 may be about 46 mm. Example dimensions for various portions of device 100 that may be utilized in some embodiments include: slots 133 may be about 10 mm wide and about 560 mm long; pillars 156 may have the dimensions of about 160 mm wide squares with a height of about 267 mm; and ridges 154 may have a width of about 294 mm and a height of ridges 154 may be substantially similar to pillars 156. In some embodiments, the ridge width may be increased (e.g., up to 535 mm) in order to aid in impedance matching.

In some embodiments, pillars 156 that run along a direction that is the same as the largest dimension of chip carrier 130 have a height that is less than the other pillars 156 that surround ridges 154 (see FIG. 4B). In other embodiments, pillars 156 that run along a direction that is the same as the largest dimension of chip carrier 130 may have more than one dimension that is less than the dimensions of the other pillars 156 that surround ridges 154 (see also FIGS. 1 & 2).

Figure 2:
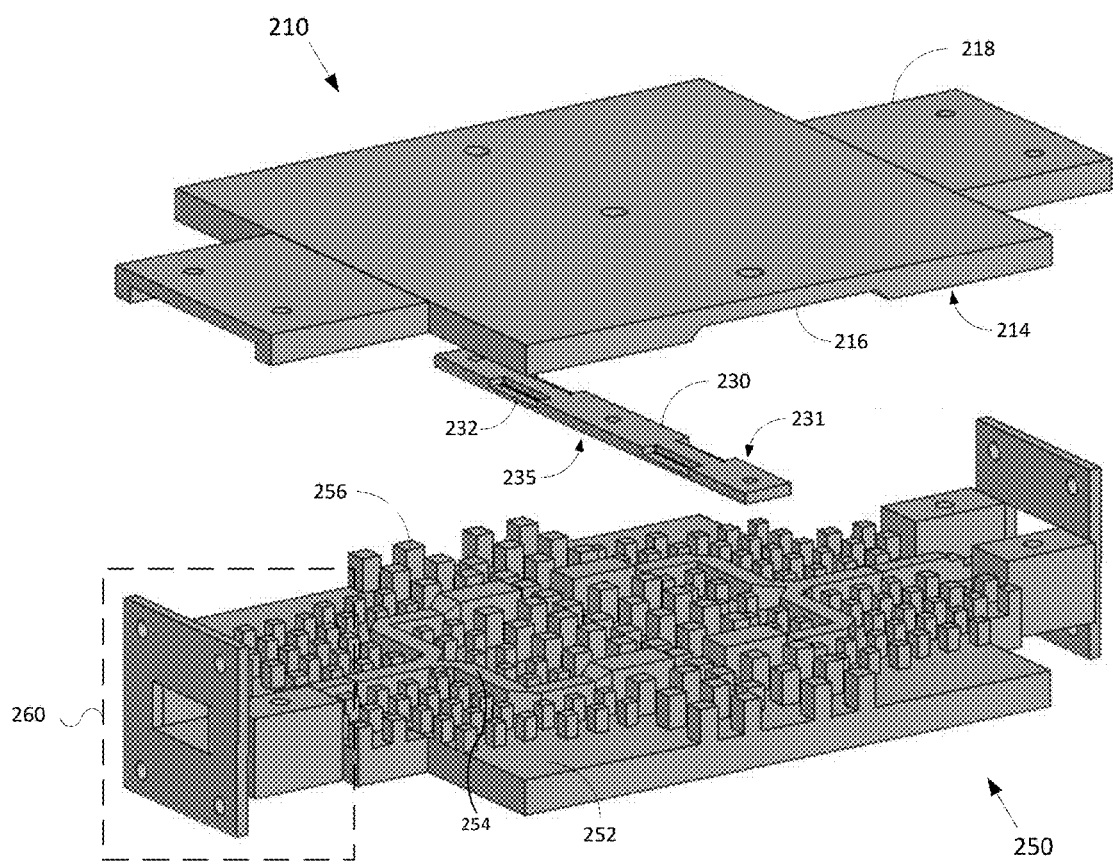
FIG. 2 is an exploded view of another embodiment of a device in accordance with the subject matter of the present disclosure.
Figure 3:
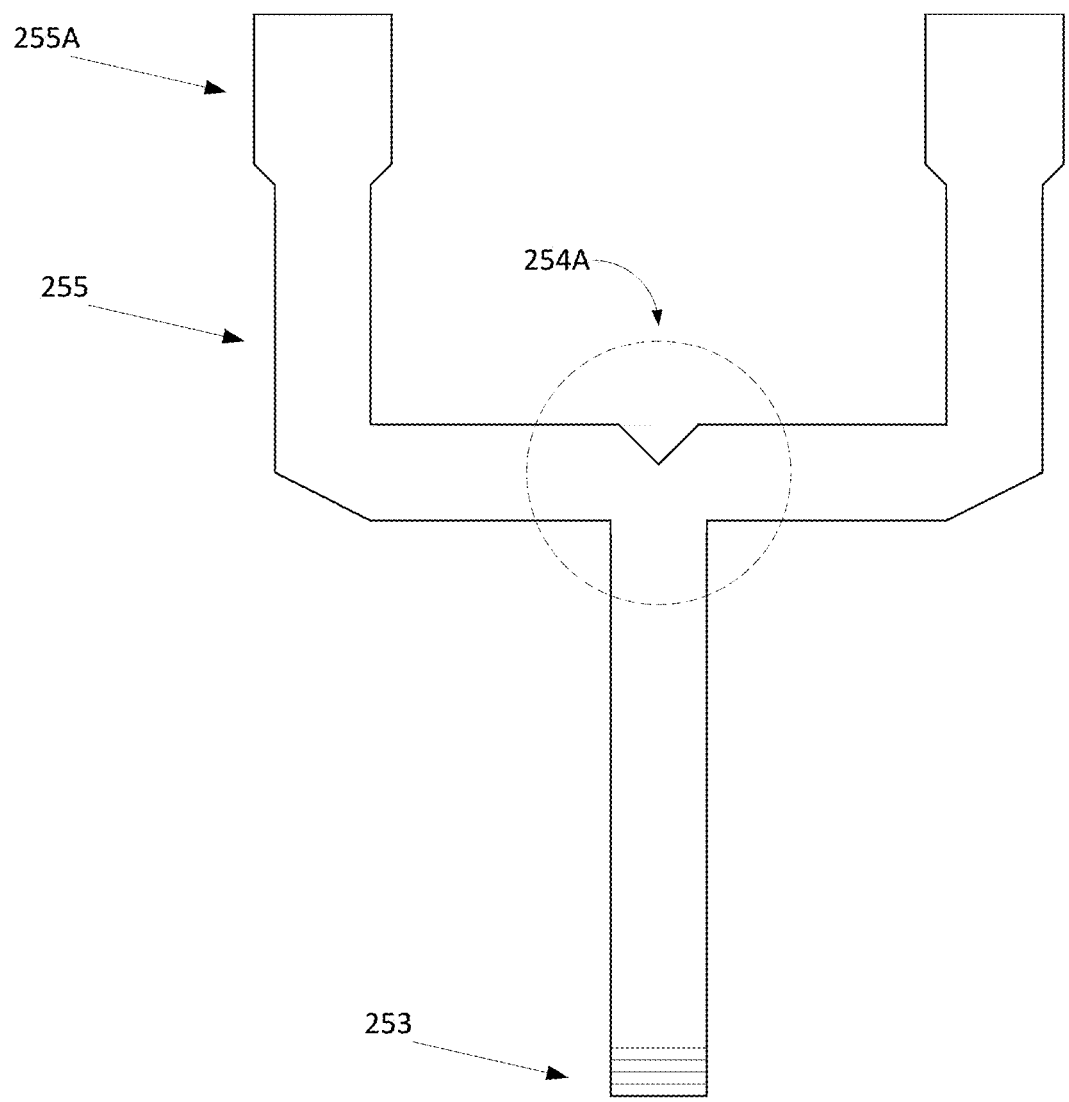
FIG. 3 illustrates an isolated view of a ridge having a branching junction in accordance with the embodiment of FIG. 2.

FIG. 2 shows an exploded view of an embodiment of a device 200 having components and functions similar to device 100 shown in FIG. 1. Components and functions of device 200 that are substantially similar or identical to device 100 may not be further described. Device 200 may include enclosure cover 210 having a groove portion 216 disposed on one surface 214. Chip carrier 230 may be attachable to and removable from enclosure cover 210 in groove portion 216. Chip carrier 230 may include at least two cavities 232 disposed on one surface 231 and located on opposite sides, each cavity 232 may include a slot 233 extending to an opposite surface 235 of chip carrier 230. RGW cover 250 may include a plurality of pillars 256 disposed on one surface 252. A plurality of ridges 254 may be disposed on one surface 252, and each ridge 254 may include a branching junction 254A such that each ridge 254 branches to at least two ridge portions 255 (FIGS. 2 & 3 show an embodiment of branching junction 254A as a T-junction). Enclosure cover 210 and RGW cover 250 are configured to connect to each other with chip carrier 230 located therebetween and such that opposite surface 235 of chip carrier 230 faces one surface 252 of RGW cover 250 when covers 210 and 250 are connected. Each ridge portion 255 may include a platform portion 255A at one end having at least one dimension greater than at least one dimension of its respective ridge 254 or ridge portion 255. In some embodiments, the pillars 256 for the branching junctions 254A have a width of about 110 mm, a height of about 184 mm, a spacing of about 166 mm, and a gap height of about 32 mm (the gap height may range from about 32 mm to about 46 mm); ridges 254 may have a width of about 187 mm. In various embodiments, the width, height, and gap of pillars 256, as well as ridges 254, may be adjusted to tune the performance of device 200.

FIG. 2 shows fins 218 on opposite ends of enclosure cover 210 that are designed to fit to sections 260 of RGW cover 250 for the purpose of connecting the covers 210 and 250.

Figure 7:
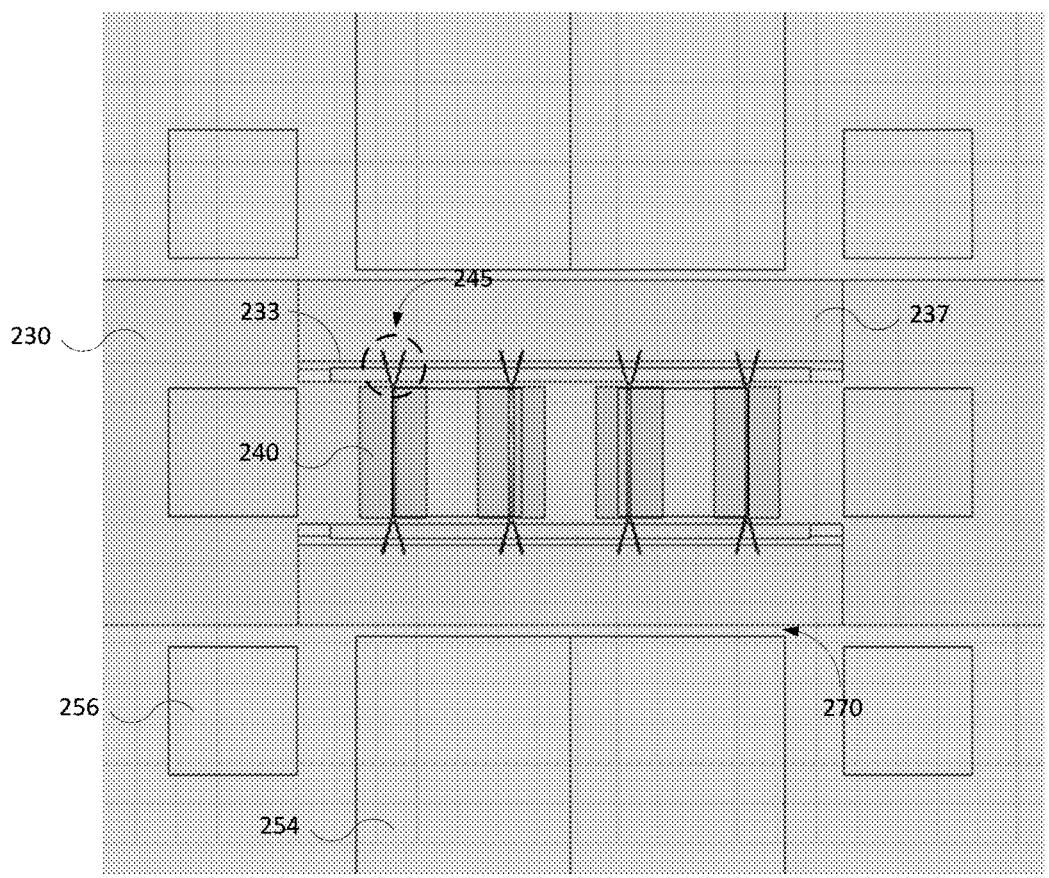
FIG. 7 illustrates a top view of a device including a chip carrier having multiple MMICs.

A plurality of MMICs 240 may be located on opposite surface 235 of chip carrier 230 and between slots 233, as shown in FIG. 7. MMICs 240 may be connected to chip carrier 230 via bond wires 245 located on opposite sides of the MMICs 240 and extending across the slots 233 with dual wedge bonds. Each ridge 254 in the plurality of ridges may be surrounded by the plurality of pillars 256 on opposite sides of each ridge 254 and on opposite sides of each ridge portion 255 such that propagation of a quasi-TEM wave is facilitated between the plurality of ridges 254 and enclosure cover 210 when connected to RGW cover 250. It should be understood that references to ridges 154/254 may include any/all parts of said ridges.

Pillars 256 in device 200 may be configured to form a high-impedance structure preventing the quasi-TEM wave from propagating in a direction other than a direction along the plurality of ridges 254. Pillars 256 may also be configured to prevent higher order parallel plate modes from occurring. Each pillar 256 may be at least a quarter-wave ($\lambda/4$) in height, and the width of each pillar 256 may be less than the width of each ridge 256.

The quasi-TEM wave may propagate through cavities 232 in chip carrier 230 and into slots 233, wherein slots 233 may be configured to act as resonant slot antennas such that the quasi-TEM wave propagates through slots 233 and the bond wires 245 act as the transmission medium for the quasi-TEM wave to the MMICs 240. Each slot 233 may have at least one dimension that is substantially equal to at least one dimension of its corresponding cavity 232 (see FIG. 10; see also FIG. 6). The bond wires 245 may extend across slots 233 and may be bonded to pedestal portions 237 (see FIG. 4B, wherein the layout shown in the side profile view of device 100 is substantially similar to device 200).

Device 200 may include a plurality of parallelepiped waveguides (see section 260 showing one of the parallelepiped waveguides) disposed on one surface 252 of RGW cover 250 and on opposite sides (although not marked in FIG. 2, another parallelepiped waveguide is shown on a side of RGW cover 250 opposite the side with section 260). FIG. 3 shows a transition portion 253 of a ridge 254 in the plurality of ridges 254, which may be located substantially within each parallelepiped waveguide 260. Transition portion 253 may be stepped or sloped; transition portion 253 may begin at one surface 252 of RGW cover 250 and end at a top side of the ridge 254 (see FIGS. 5A & 5B). As previously stated, the slope may aid in preventing discontinuities and improve impedance matching.

Chip carrier 230 may include a pedestal portion 237 adjacent to each slot 233 on a side opposite the MMICs 240 (see FIG. 6). Each pedestal portion 237 may be located on opposite surface 235 and directly abutting a cavity 232. The length and width of each pedestal portion 237 may correspond to an operating frequency.

Figure 8A:
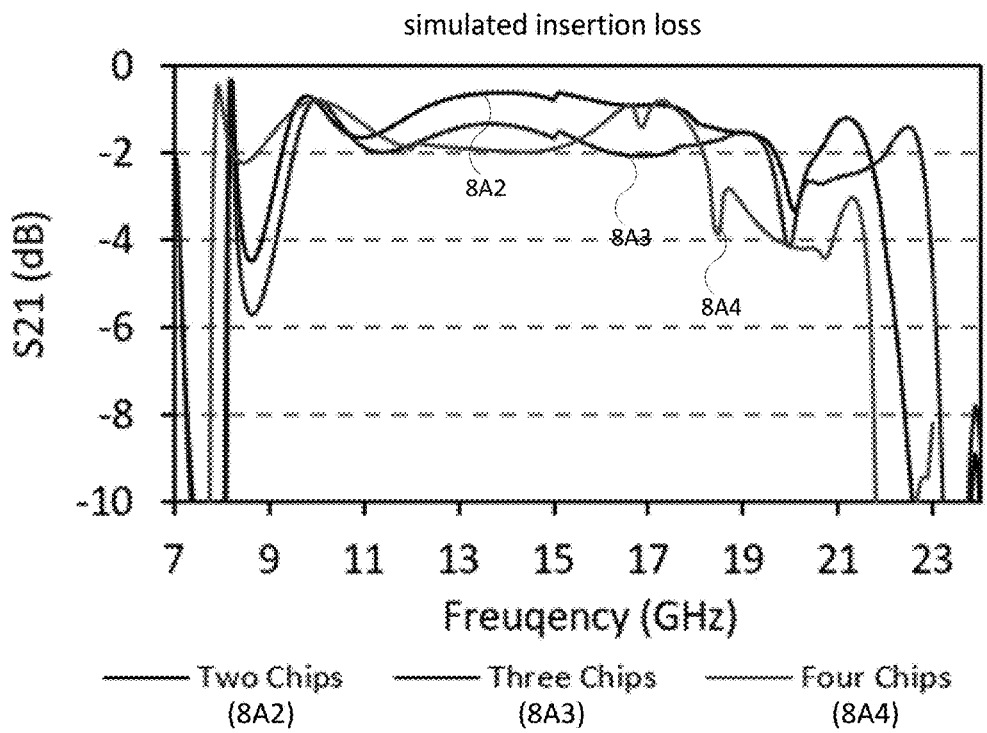
FIGS. 8A, 8B & 8C show graphs of simulated and measured results for insertion loss and return loss.
Figure 8B:
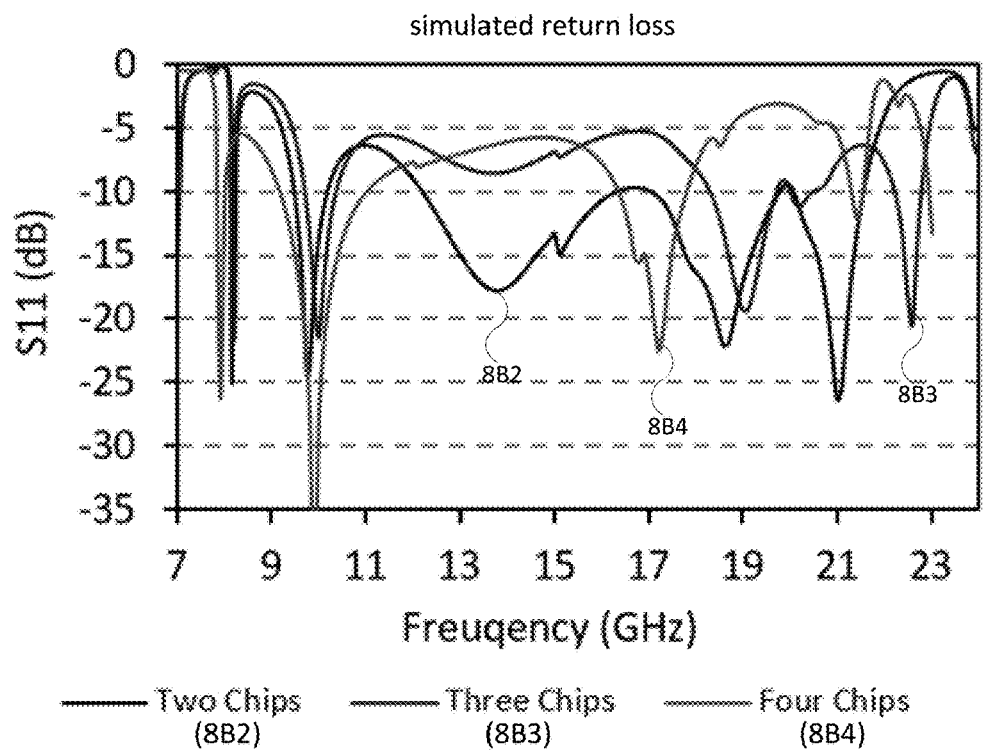
Figure 8C:
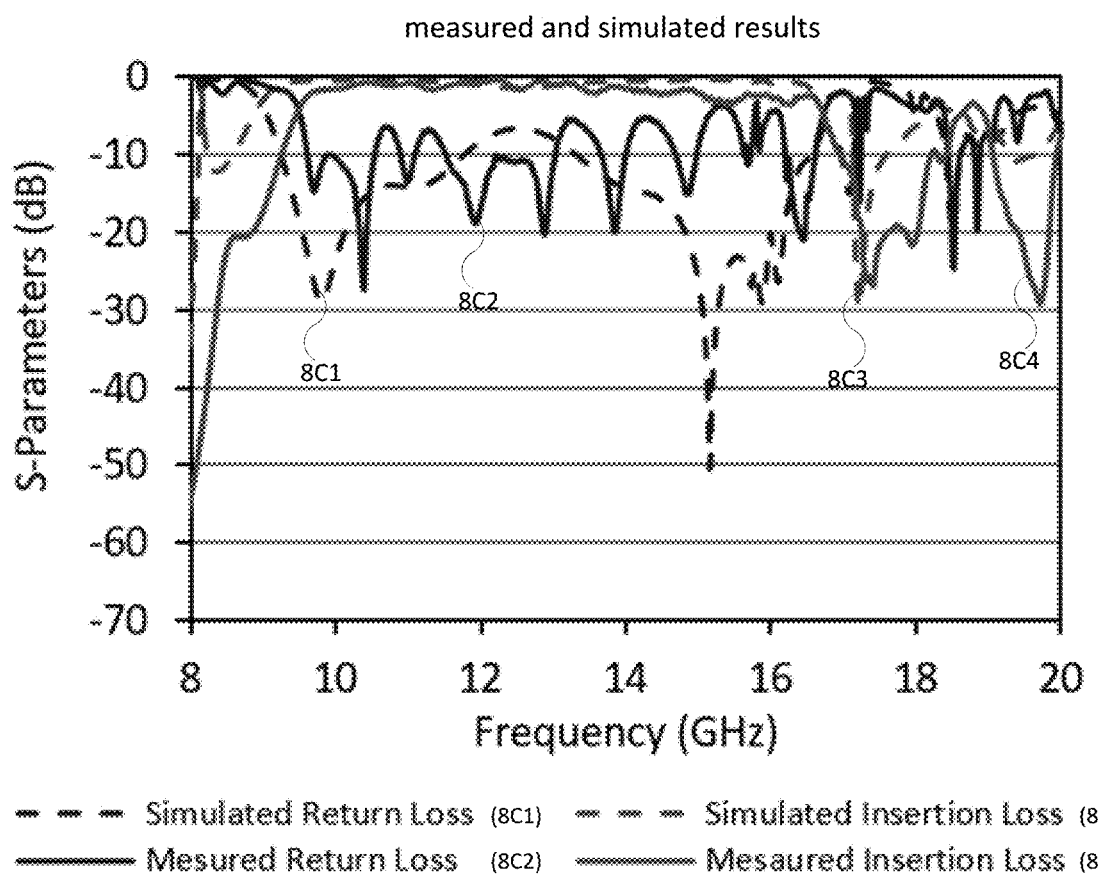
Figure 9:
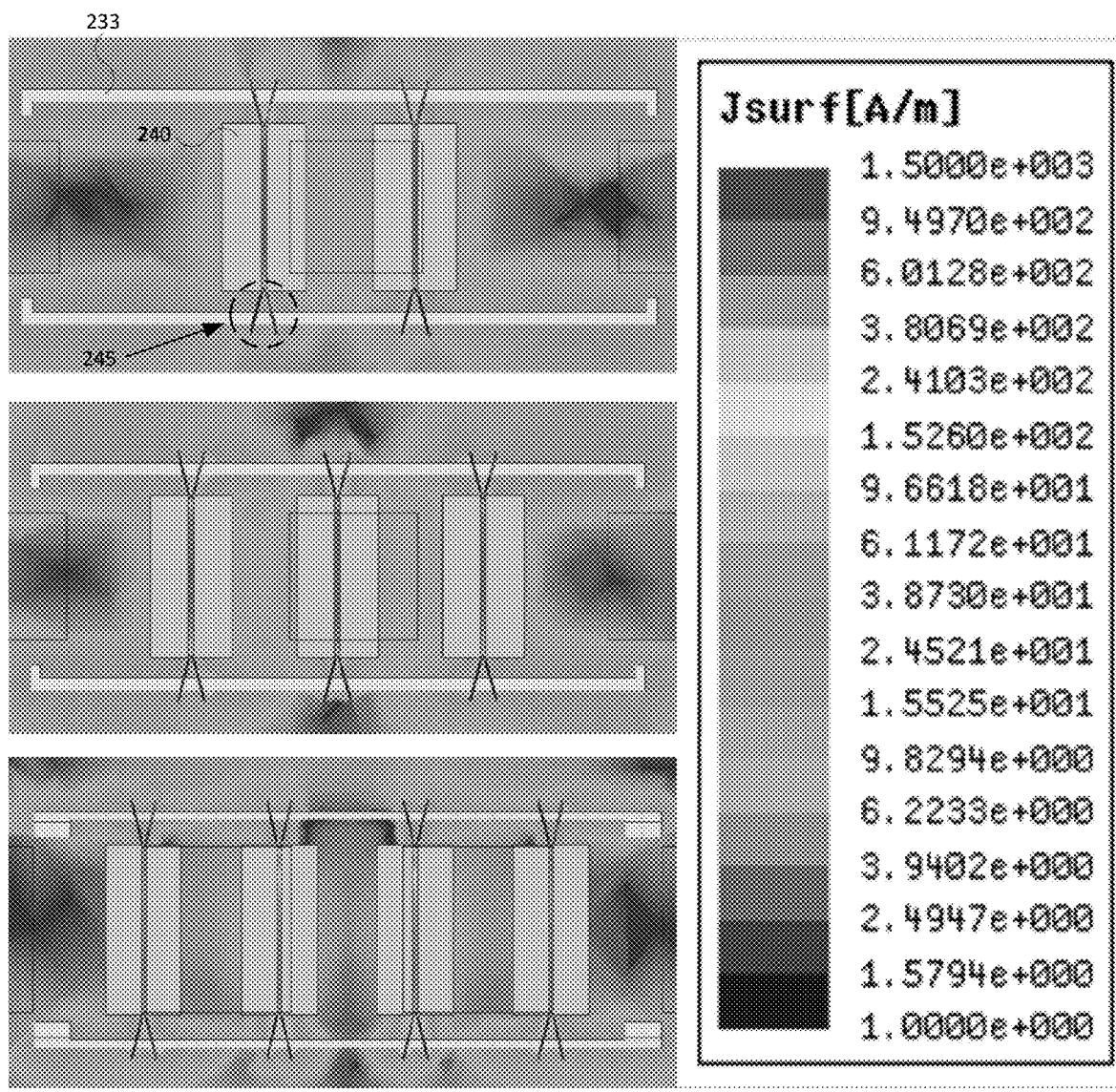
FIG. 9 shows multiple configurations of MMICs and their respective power distributions.

The plurality of MMICs 240 may be configured for current mode power combining such that a quasi-TEM wave propagates through MMICs 240 with substantially equal distribution (see FIG. 9). Current mode power combining may yield an insertion loss of less than 2 dB in a frequency range of about 9 GHz to about 16 GHz (see FIG. 8A-C showing simulated and measured results). FIG. 8A shows simulated insertion loss results for a plurality of chips (MMICs) plotted as lines 8A2, 8A3, and 8A4. FIG. 8B shows simulated return loss results for a plurality of chips (MMICs) plotted as lines 8B2, 8B3, and 8B4. FIG. 8C shows measured and simulated results for return loss and insertion loss plotted as lines 8C1, 8C2, 8C3, and 8C4. As an example, FIG. 9 shows the surface current magnitude at 10 GHz for various configurations in which the signal is propagating with equal distribution through each of the transmission lines (MMICs). Device 200 may also exhibit broadband performance with a 3 dB bandwidth of 10 GHz. The current mode power combining obviates the need for binary power combining and allows for power amplifier MMICs to be placed closer in proximity to one another, thereby improving the power density for a given space constraint.

Figure 10:
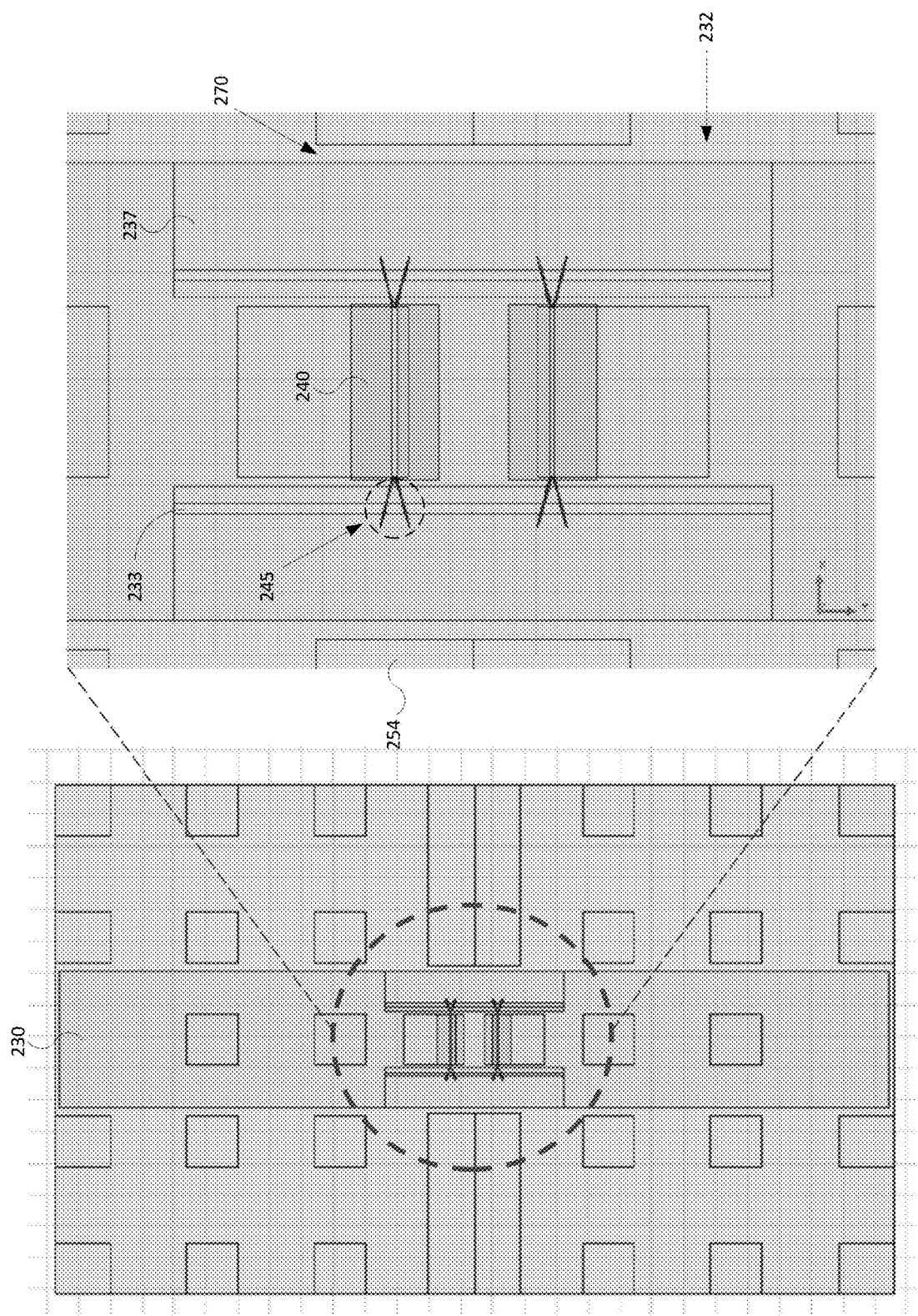
FIG. 10 illustrates a zoom-in view of a section of a chip carrier including multiple MMICs.

As shown in FIG. 10 (a top view of device 200 when covers 210 and 250 are connected (chip carrier 230 is below RGW cover 250)), the plurality of MMICs are located between slots 233, which are longer than the width of a single MMIC 240 (example dimensions of an MMIC may be about 2000 μm×1500 μm). In this configuration, the input and output impedances are halved, and the transition is appropriately tuned such that the impedance transformation is from, e.g., 25 ohms to 50 ohms. The width of the coupling gap 270 may be adjusted to achieve said tuning. The length of slots 233 adjusts the frequency response.

Figure 11A:
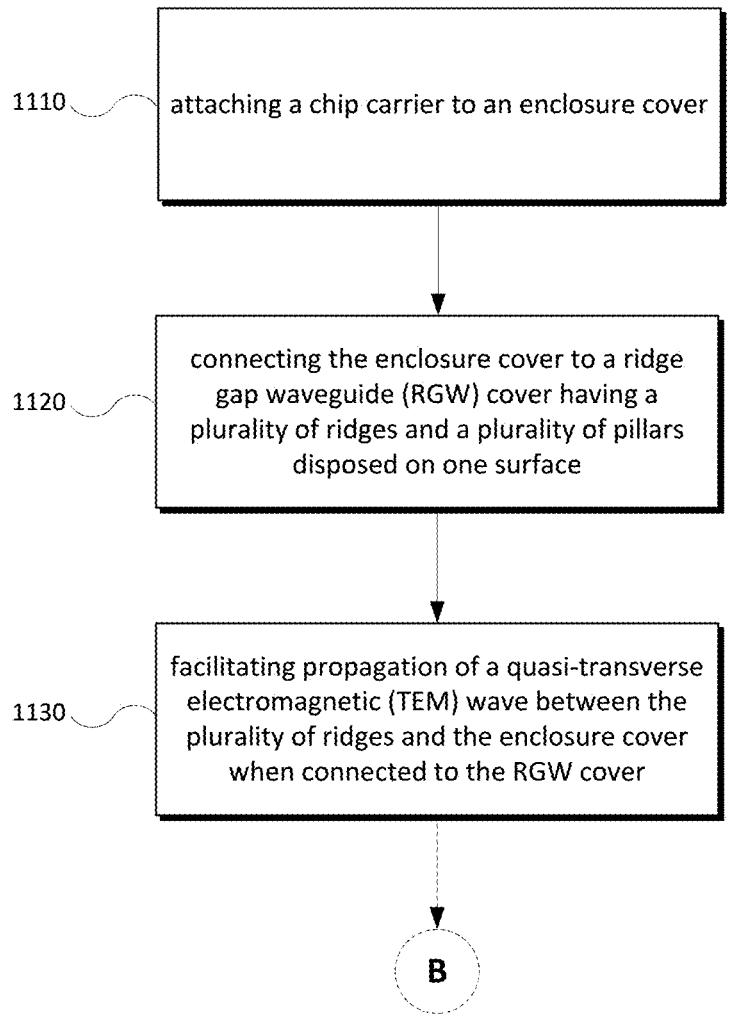
FIGS. 11A & 11B illustrate a flowchart of an embodiment of a method in accordance with the subject matter of the present disclosure.
Figure 11B:
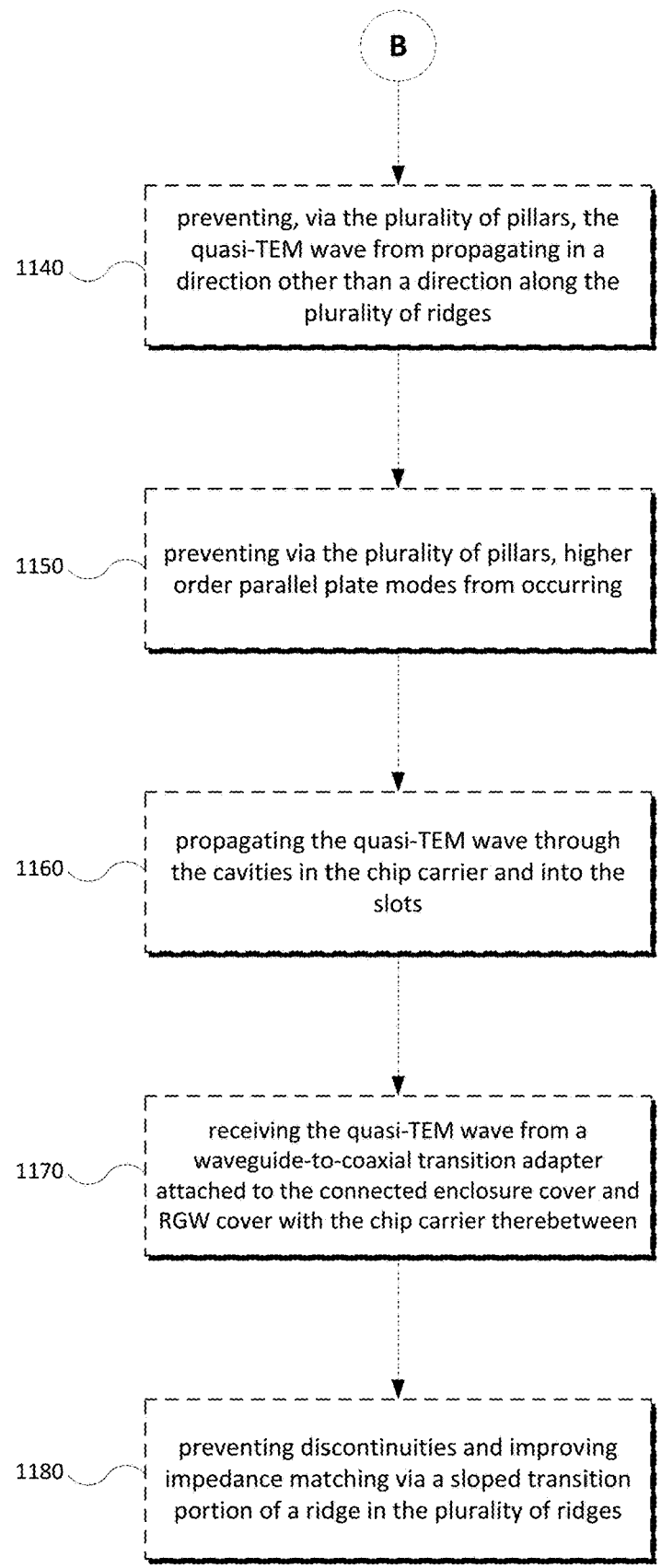

FIGS. 11A & 11B show a flowchart of an embodiment of a method in accordance with the subject matter of the present disclosure. Method 1100 may be implemented as a series of modules, and the modules may function in concert with physical electronic and computer hardware devices. Such modules may be utilized separately and/or together, locally and/or remotely, to form a program product thereof, which may be implemented through recordable media. Some or all of the steps of method 1100 may be stored within non-transitory computer-readable media, wherein the steps are represented by computer-readable programming code. The aforementioned statements are also applicable to method 1200 shown in FIGS. 12A & 12B.

For illustrative purposes, method 1100 will be discussed with reference to various other figures. Additionally, while FIGS. 11A & 11B show an embodiment of method 1100, other embodiments of method 1100 may contain fewer or more steps. Although in some embodiments the steps of method 1100 may be performed as shown in FIGS. 11A & 11B, in other embodiments the steps may be performed in a different order, or certain steps may occur simultaneously with one or more other steps. The aforementioned statements are also applicable to method 1200 shown in FIGS. 12A & 12B.

As shown in FIG. 11A, step 1110 of method 1100 may include attaching chip carrier 130 to enclosure cover 110, wherein chip carrier 130 is attachable to and removable from enclosure cover 110, and wherein chip carrier 130 includes at least two cavities 132 disposed on one surface 131 and located on opposite sides of surface 131, each cavity 132 having a slot 133 extending to an opposite surface 135 of chip carrier 130.

Step 1120 may include connecting enclosure cover 110 to RGW cover 150 having a plurality of ridges 154 and a plurality of pillars 156 disposed on one surface 152, wherein chip carrier 130 is located in-between covers 110 and 130, and wherein opposite surface 135 of chip carrier 130 faces the one surface 152 of RGW cover 150.

Step 1130 may include facilitating propagation of a quasi-TEM wave between ridges 154 and enclosure cover 110 when connected to RGW cover 150, wherein each ridge 154 in the plurality of ridges 154 is surrounded by the plurality of pillars 156 on opposite sides of each ridge 154. The quasi-TEM wave is propagated between enclosure cover 110 and ridge 154 (this space may be referred to as the "gap" and may correspond to gap height 180).

In some embodiments, method 1100 may further include (as shown in FIG. 11B) a step 1140 for preventing, via the plurality of pillars 156, the quasi-TEM wave from propagating in a direction other than a direction along the plurality of ridges 154, wherein the pillars 156 are configured as a high-impedance structure. Step 1150 may also be included for preventing, via the plurality of pillars 156, higher order parallel plate modes from occurring.

In some embodiments, MMIC 140 may be located on opposite surface 135 of chip carrier 130 and in-between slots 133. MMIC 140 may be connected to chip carrier 130 via bond wires 145 located on opposite sides of the MMIC 140 and extending across slots 133 with dual wedge bonds.

In some embodiments, method 1100 may further include a step 1160 for propagating the quasi-TEM wave through cavities 132 in chip carrier 130 and into slots 133, wherein slots 133 are configured to act as resonant slot antennas such that the quasi-TEM wave propagates through slots 133 and bond wires 145 act as the transmission medium for the quasi-TEM wave to MMIC 140. Each slot 133 may have one dimension that is substantially equal to one dimension of its corresponding cavity 132.

In some embodiments, method 1100 may further include a step 1170 for receiving the quasi-TEM wave from a waveguide-to-coaxial transition adapter (not shown) attached to device 100, wherein enclosure cover 110 is connected to RGW cover 150 with chip carrier 130 therebetween.

In some embodiments, method 1100 may further include a step 1180 for preventing discontinuities and improving impedance matching via a sloped transition portion 153B of a ridge 154 in the plurality of ridges 154, wherein the sloped transition portion 153B is located within a parallelepiped waveguide 160 disposed on one surface 152 of RGW cover 150, and wherein the slope begins at one surface 152 and ends at a top side of the ridge 154. The width of each ridge 154 in the plurality of ridges 154 may be greater than the width of each pillar 156 in the plurality of pillars 156.

Figure 12A:
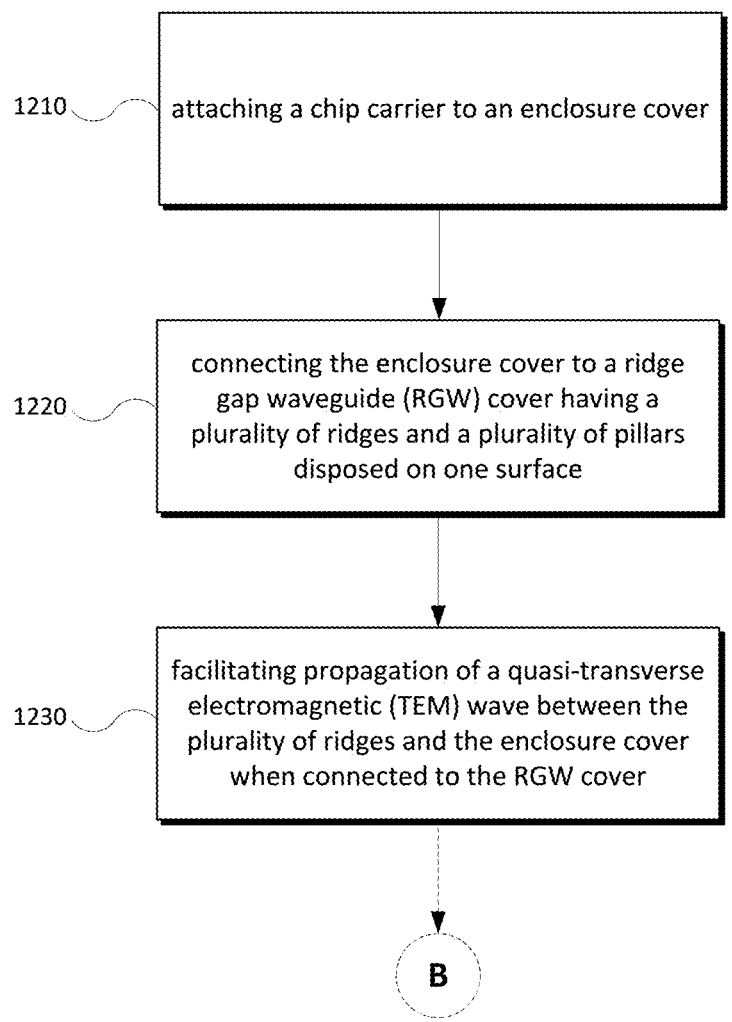
FIGS. 12A & 12B illustrate a flowchart of another embodiment of a method in accordance with the subject matter of the present disclosure.

As shown in FIG. 12A, step 1210 of method 1200 may include attaching chip carrier 230 to enclosure cover 210, wherein chip carrier 230 is attachable to and removable from a groove portion 216 disposed on one surface 214 of enclosure cover 210, and wherein chip carrier 230 includes at least two cavities 232 disposed on one surface 231 and located on opposite sides of the one surface 231, each cavity 232 having a slot 233 extending to an opposite surface 235 of chip carrier 230.

Step 1220 may include connecting enclosure cover 210 to RGW cover 250 having a plurality of ridges 254 and a plurality of pillars 256 disposed on one surface 252, wherein each ridge 254 includes a branching junction 254A such that each ridge 254 branches to at least two ridge portions 255, wherein chip carrier 230 is located in-between covers 210 and 250, and wherein the opposite surface 235 of chip carrier 230 faces the one surface 252 of RGW cover 250.

Step 1230 may include facilitating propagation of a quasi-TEM wave between the plurality of ridges 254 and enclosure cover 210 when connected to RGW cover 250, wherein each ridge 254 is surrounded by the plurality of pillars 256 on opposite sides of each ridge 254 and on opposite sides of each ridge portion 255. In some embodiments, each ridge portion 255 may include a platform portion 255A at one end having at least one dimension greater than at least one dimension of its respective ridge 254.

Figure 12B:
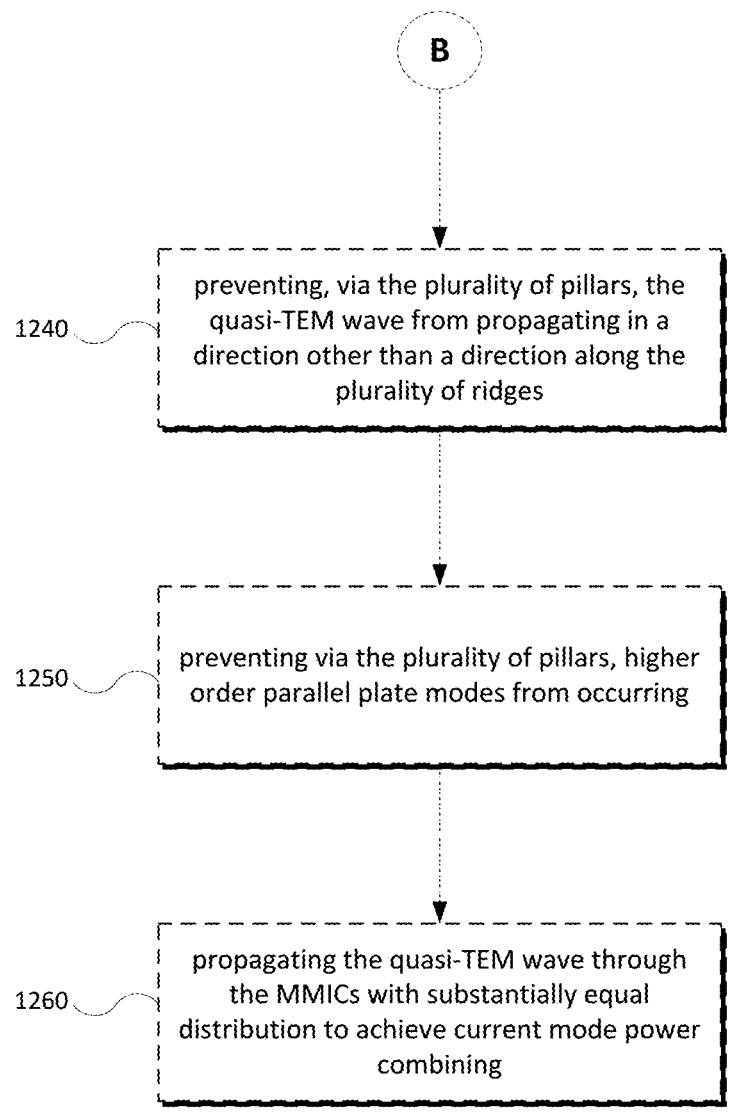

In some embodiments, method 1200 may further include (as shown in FIG. 12B) a step 1240 for preventing, via the plurality of pillars, the quasi-TEM wave from propagating in a direction other than a direction along the plurality of ridges, wherein the pillars are configured to form a high-impedance structure. Step 1250 may also be included for preventing, via the plurality of pillars, higher order parallel plate modes from occurring.

The plurality of MMICs may be located on opposite surface 235 of chip carrier 230 and in-between slots 233, and the MMICs may be connected to chip carrier 230 via bond wires 245 located on opposite sides of MMICs 240 and extending across slots 233 with dual wedge bonds.

In some embodiments, method 1200 may further include a step 1260 for propagating the quasi-TEM wave through MMICs 240 with substantially equal distribution to achieve current mode power combining. Current mode power combining may yield an insertion loss of less than 2 dB in a frequency range of about 9 GHz to about 16 GHz.

The use of any examples, or example-language ("e.g.," "such as," etc.), provided herein is merely intended to better illuminate and is not intended to pose a limitation on the scope of the subject matter unless otherwise claimed. No language in the present disclosure should be construed as indicating that any non-claimed element is essential.

Many modifications and variations of the subject matter of the present disclosure are possible in light of the above description. It should be understood that features described in certain embodiments may be present in, or applicable to, other embodiments although not expressly described in the other embodiments. Within the scope of the appended claims, the embodiments described herein may be practiced otherwise than as specifically described. The scope of the claims is not limited to the disclosed implementations and embodiments but extends to other implementations and embodiments as may be contemplated by those having ordinary skill in the art.

What is claimed is:

1. A device comprising:
    an enclosure cover including a groove portion disposed on one surface;
        a chip carrier attachable to and removable from the enclosure cover in the groove portion, the chip carrier including at least two cavities disposed on one surface and located on opposite sides, each cavity having a slot extending to an opposite surface of the chip carrier;
        a ridge gap waveguide (RGW) cover including a plurality of pillars disposed on one surface; and
        a plurality of ridges disposed on the one surface of the RGW cover, wherein each ridge includes a branching junction such that each ridge branches to at least two ridge portions,
        wherein the enclosure cover and the RGW cover are configured to connect to each other with the chip carrier located therebetween, and
        wherein the opposite surface of the chip carrier faces the one surface of the RGW cover when the enclosure cover and the RGW cover are connected.

2. The device of claim 1, wherein each ridge portion includes a platform portion at one end having at least one dimension greater than at least one dimension of its respective ridge.

3. The device of claim 1, further comprising:
    a plurality of millimeter-wave monolithic integrated circuits (MMICs) located on the opposite surface of the chip carrier and in-between the slots.

4. The device of claim 3, wherein the MMICs are connected to the chip carrier via bond wires located on opposite sides of the MMICs and extending across the slots with dual wedge bonds.

5. The device of claim 1, wherein each ridge in the plurality of ridges is surrounded by the plurality of pillars on opposite sides of each ridge and on opposite sides of each ridge portion such that propagation of a quasi-transverse electromagnetic (TEM) wave is facilitated between the plurality of ridges and the enclosure cover when connected to the RGW cover.

6. The device of claim 5, wherein the plurality of pillars is configured to form a high-impedance structure preventing the quasi-TEM wave from propagating in a direction other than a direction along the plurality of ridges, and
    wherein the plurality of pillars is configured to prevent higher order parallel plate modes from occurring.

7. The device of claim 5, wherein the quasi-TEM wave propagates through the cavities in the chip carrier and into the slots, and
    wherein the slots are configured to act as resonant slot antennas such that the quasi-TEM wave propagates through the slots and the bond wires act as the transmission medium for the quasi-TEM wave to the MMICs.

8. The device of claim 1, wherein each pillar in the plurality of pillars is at least a quarter-wave ($\lambda/4$) in height, and
    wherein a width of each ridge in the plurality of ridges is greater than a width of each pillar in the plurality of pillars.

9. The device of claim 1, further comprising:
    a plurality of parallelepiped waveguides disposed on the one surface of the RGW cover and on opposite sides, wherein a transition portion of a ridge in the plurality of ridges is located substantially within each parallelepiped waveguide, and
    wherein the transition portion is sloped such that the slope begins at the one surface of the RGW cover and ends at a top side of the one ridge, and wherein the slope aids in preventing discontinuities and improve impedance matching.

10. The device of claim 1, wherein the chip carrier includes a pedestal portion adjacent to each slot on a side opposite the MMICs,
    wherein each pedestal portion is located on the opposite surface directly abutting a cavity of the at least two cavities, and
    wherein a length and a width of each pedestal portion correspond to an operating frequency.

11. The device of claim 1, wherein one dimension of each slot is substantially equal to one dimension of its corresponding cavity.

12. The device of claim 1, wherein the plurality of MMICs are configured for current mode power combining such that a quasi-transverse electromagnetic (TEM) wave propagates through the MMICs with substantially equal distribution.

13. The device of claim 12, wherein the current mode power combining yields an insertion loss of less than 2 dB in a frequency range of about 9 GHz to about 16 GHz.

14. A method comprising:
    attaching a chip carrier to an enclosure cover, wherein the chip carrier is attachable to and removable from a groove portion disposed on one surface of the enclosure cover, and wherein the chip carrier includes at least two cavities disposed on one surface and located on opposite sides, each cavity having a slot extending to an opposite surface of the chip carrier;
    connecting the enclosure cover to a ridge gap waveguide (RGW) cover having a plurality of ridges and a plurality of pillars disposed on one surface, wherein each ridge includes a branching junction such that each ridge branches to at least two ridge portions, wherein the chip carrier is located between the covers, and wherein the opposite surface of the chip carrier faces the one surface of the RGW cover; and
    facilitating propagation of a quasi-transverse electromagnetic (TEM) wave between the plurality of ridges and the enclosure cover when connected to the RGW cover, wherein each ridge in the plurality of ridges is surrounded by the plurality of pillars on opposite sides of each ridge and on opposite sides of each ridge portion.

15. The method of claim 14, wherein each additional ridge portion includes a platform portion at one end having at least one dimension greater than at least one dimension of its respective ridge.

16. The method of claim 14, further comprising:
preventing, via the plurality of pillars, the quasi-TEM wave from propagating in a direction other than a direction along the plurality of ridges, wherein the pillars are configured to form a high-impedance structure; and
preventing via the plurality of pillars, higher order parallel plate modes from occurring.

17. The method of claim 14, wherein a plurality of millimeter-wave monolithic integrated circuits (MMICs) is located on the opposite surface of the chip carrier and in-between the slots, and
wherein the MMICs are connected to the chip carrier via bond wires located on opposite sides of the MMICs and extending across the slots with dual wedge bonds.

18. The method of claim 17, further comprising:
propagating the quasi-TEM wave through the MMICs with substantially equal distribution to achieve current mode power combining.

19. The method of claim 18, wherein the current mode power combining yields an insertion loss of less than 2 dB in a frequency range of about 9 GHz to about 16 GHz.

20. A device comprising:
an enclosure cover;
a chip carrier attachable to and removable from the enclosure cover, the chip carrier including at least two cavities disposed on one surface and located on opposite sides, each cavity having a slot extending to an opposite surface of the chip carrier;
a ridge gap waveguide (RGW) cover including a plurality of pillars disposed on one surface;
a plurality of ridges disposed on the one surface of the RGW cover, wherein each ridge includes a platform portion at one end having at least one dimension greater than at least one dimension of its respective ridge; and
a plurality of millimeter-wave monolithic integrated circuits (MMICs) located on the opposite surface of the chip carrier and in-between the slots,
wherein the enclosure cover and the RGW cover are configured to connect to each other with the chip carrier located therebetween, and
wherein the opposite surface of the chip carrier faces the one surface of the RGW cover when the enclosure cover and the RGW cover are connected.

* * * * *